United States Patent

[11] 3,609,475

[72] Inventor George N. Kaposhilin
Palo Alto, Calif.
[21] Appl. No. 34,078
[22] Filed May 4, 1970
[45] Patented Sept. 28, 1971
[73] Assignee Hewlett-Packard Company
Palo Alto, Calif.

[54] LIGHT-EMITTING DIODE PACKAGE WITH DUAL-COLORED PLASTIC ENCAPSULATION
4 Claims, 4 Drawing Figs.

[52] U.S. Cl. .......... 317/234 R, 317/235 R, 317/234 E, 317/235 N, 313/108 D
[51] Int. Cl. .......... H01l 1/00
[50] Field of Search .......... 317/234 (3), 234 (3.1), 235 (4); 313/308 D

[56] References Cited

UNITED STATES PATENTS

| | | | |
|---|---|---|---|
| 3,458,779 | 7/1967 | Blank et al. | 317/234 |
| 3,512,027 | 5/1970 | Kupsky | 313/108 |
| 3,354,316 | 11/1967 | Deverall | 250/217 |
| 3,510,732 | 5/1970 | Amans | 317/234 |
| 2,898,474 | 8/1959 | Rutz | 250/211 |
| 3,444,440 | 5/1969 | Bell et al. | 317/234 |
| 3,367,025 | 2/1968 | Doyle | 29/588 |

*Primary Examiner*—John W. Huckert
*Assistant Examiner*—B. Estrin
*Attorney*—Roland I. Griffin

ABSTRACT: A light-emitting diode (LED) is bonded to a pair of metal leads which are attached to a metal lead frame with a plurality of lead pairs, such that its optical axis is parallel to the longitudinal axis of the leads. The device so formed is encapsulated in two colors of plastic, a clear portion over the diode to transmit light from the diode and a dark portion behind the diode to improve the diode on-off contrast and make a hermetic seal with the leads. After encapsulation individual devices are separated from each other by cutting the leads from the lead frame.

INVENTOR
GEORGE N. KAPOSHILIN
BY Roland I. Griffin
ATTORNEY

INVENTOR
GEORGE N. KAPOSHILIN
BY Roland I. Griffin
ATTORNEY

LIGHT-EMITTING DIODE PACKAGE WITH DUAL-COLORED PLASTIC ENCAPSULATION

BACKGROUND OF THE INVENTION

A light-emitting diode (LED) is a semiconductor device which emits light when current is passed through it in the forward direction. The diode itself is very small and must be mounted in a structure which will: (1) protect it from moisture, contamination and damage, (2) provide a good electrical path between the diode and other devices, (3) provide a good heat sink, (4) allow maximum transmission of the light, (5) provide a dark background for the diode for good contrast, (6) allow the diode's optical axis to be parallel with the longitudinal axis of the electrical leads, and (7) provide for ease of handling and mounting in electrical apparatus.

In the past LED's were mounted in packages similar to those used for transistors. The packages consisted of a glass header with the leads molded in the glass to provide a hermetic seal and a cylindrical metal can which fastened to the header to form a sealed package. The end of the can opposite the leads was transparent to transmit the light from the LED. Before fastening the can to the header, the LED was bonded to the leads which came through the header. Following the bonding operation the can was attached to the header, usually in an inert atmosphere to hermetically seal the device. This process was expensive because of the amount of manual labor required and the materials used.

SUMMARY OF THE INVENTION

It is an object of the present invention to provide a package for a LED which will meet the criteria set forth in the first paragraph under "background." In the preferred embodiment of the present invention the LED is bonded to a pair of metal leads, the pair being one of many on a lead frame and this bonding is accomplished in an automatic die attach and bonding operation. The metal leads provide a heat sink and electrical path for connection to external devices. The LED is bonded to the leads such that its optical axis is parallel to the longitudinal axis of the leads. After the bonding operation the LED and a portion of the leads are encapsulated in a two-color plastic housing. The portion of the housing through which the leads emerge is dark in color; it provides a dark background for good contrast and it seals around the leads to protect the LED from moisture, etc. The other portion of the housing is transparent to allow maximum transmission of light from the LED. The configuration of the leads makes it easy to mount the device in a printed circuit board, attach wires to the device using wire-wrap techniques, or solder wires to the device. The entire manufacturing process can be done automatically, thus reducing the cost of manufacture over previous techniques.

DESCRIPTION OF THE PREFERRED EMBODIMENT

Figure 1:
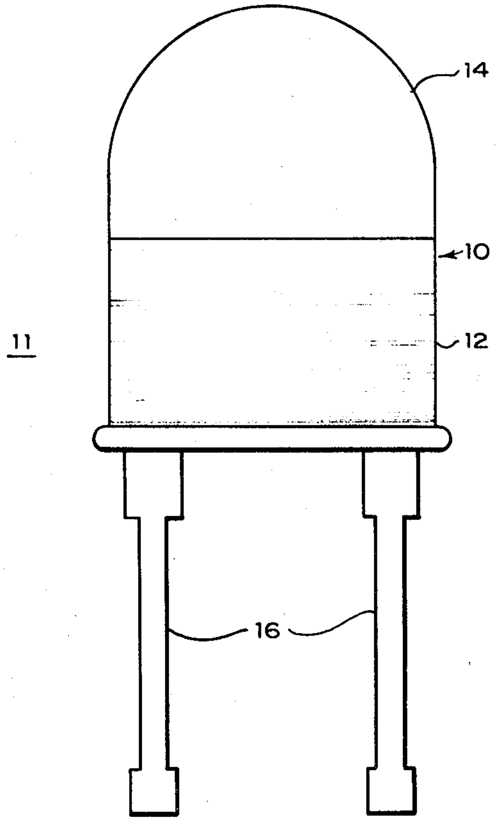
FIG. 1 shows a packaged LED in accordance with the preferred embodiment of this invention.

FIG. 1 shows a packaged LED 11 comprising the plastic housing 10 and leads 16. Plastic housing 10 comprises transparent portion 14 and dark-colored portion 12, with leads 16 emerging from dark-colored portion 12.

Figure 2:
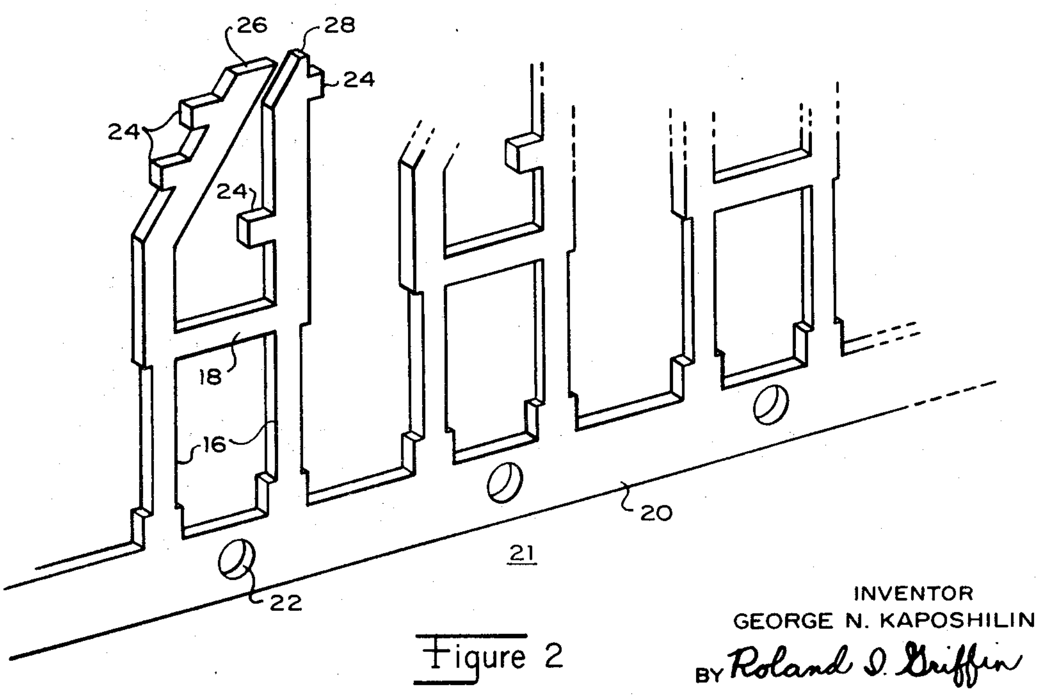
FIG. 2 shows a lead frame used in the manufacture of the packaged LED in accordance with the preferred embodiment.

FIG. 2 shows a segment of a lead frame 21 which includes mounting portion 20 leads 16, tie bar 18 and locking tabs 24. The lead frame 21 is a one-piece metal stamping. The mounting portion 20 and tie bar 18 hold the leads 16 in a precise relationship to each other and the mounting portion 20 during the manufacturing process, and the indexing holes 22 in the mounting portion 20 are for precisely positioning the lead frame 21 in the machines used in the manufacturing process. Mounting surfaces 26 and 28 are for mounting and electrically contacting the LED.

Figure 3:
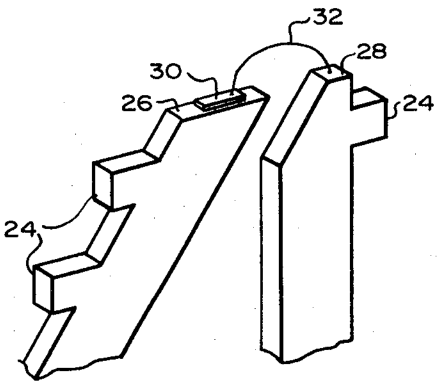
FIG. 3 shows a LED attached to a pair of leads in accordance with the preferred embodiment.

Referring to FIG. 3, the first operation in the process of manufacturing a packaged LED is to attach LED 30, a semiconductor chip or die, to mounting surface 26 in an automatic die attach machine. Next, wire 32 is bonded from LED 30 to mounting surface 28 in an automatic bonding machine. Note that the cross section of lead 16 is sufficient to provide an adequate area on mounting surface 26 for mounting LED 30 without any bending or forming operation.

Figure 4:
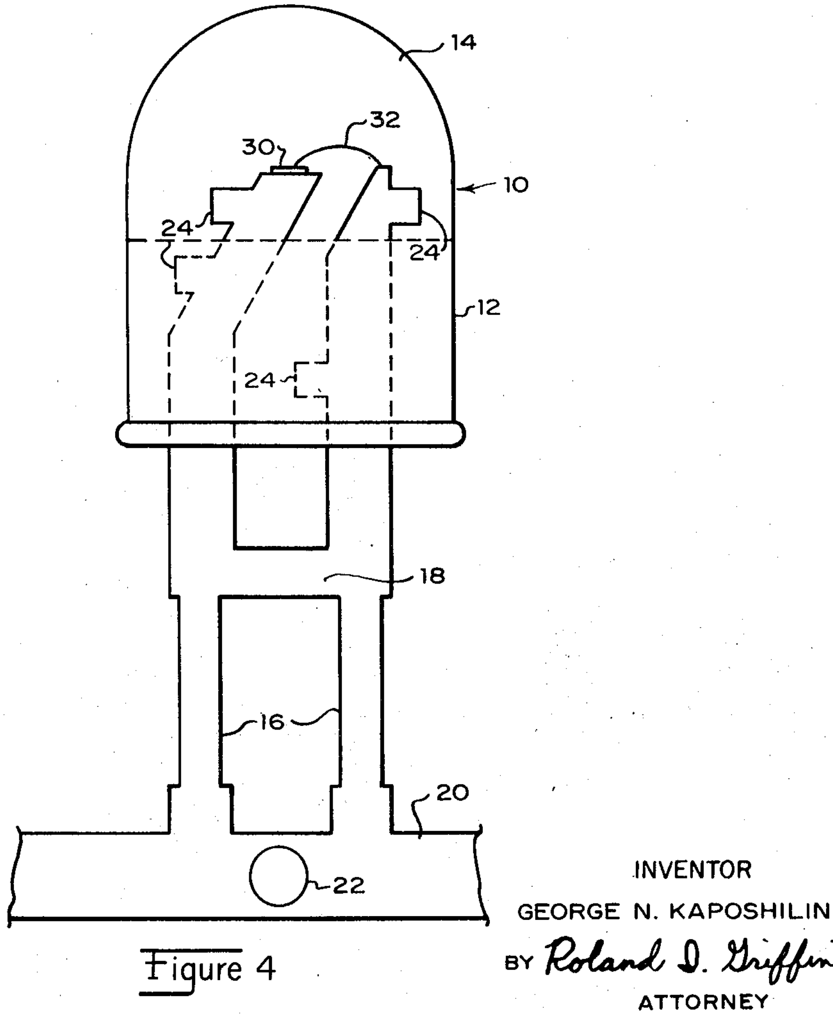
FIG. 4 shows the encapsulated LED and lead frame in accordance with the preferred embodiment.

Referring to FIG. 4, a portion of the leads 16 between LED 30 and tie bar 18 is encapsulated in a dark plastic 12 in a multiple cavity mold after the bonding operation. The type of plastic 12 is selected both for its color and its ability to make a good hermetic seal with the leads 16. Then the LED 30 is encapsulated in a clear plastic 14 in a multiple cavity mold to form a dome-shaped lens over the LED 30. The type of plastic 14 is selected for its ability to transmit light. Locking tabs 24 serve to prevent the leads from twisting or pulling out of the plastic housing 10.

Following the plastic encapsulation step, the individual packaged LED's 11 are separated by severing mounting portion 20 from the leads 16. The leads are separated by severing tie bar 18. The completed device is then as shown in FIG. 1 and it is ready to be tested and used.

It should be understood that the order of some of the steps of the process disclosed herein may be interchanged e.g. encapsulating first in plastic 14 and then in plastic 12, without departing from the spirit and scope of this invention.

I claim:

1. A package for a light-emitting diode which comprises:
   first and second metallic leads;
   a molded plastic body;
   the first lead having a mounting surface essentially perpendicular to the longitudinal axis of the first and second leads to which the light-emitting diode is fastened for maintaining the optical axis of the light-emitting diode parallel to the longitudinal axis, and the lead being thermally conductive to serve as a heat sink for the light-emitting diode;
   the second lead being spaced apart from the first lead, having a surface to which an electrode of the light-emitting diode is electrically attached;
   the molded plastic body comprising a dark-colored plastic and a transparent plastic, the dark-colored plastic encapsulating a portion of the first and second leads adjacent to but not including the light-emitting diode and providing a hermetic seal to the first and second leads, the transparent plastic encapsulating the light-emitting diode and being molded to the dark-colored plastic at a surface of said dark-colored plastic immediately adjacent to the light-emitting diode.

2. A package for a light-emitting diode as in claim 1 wherein:
   the first and second leads each have tab means protruding from them for anchoring the leads in the molded plastic body to prevent movement of the lead with respect to the plastic body.

3. A package for a light-emitting diode as in claim 2 wherein:
   the two leads are essentially parallel and are part of a metallic frame, the frame comprising a metal mounting portion means integral with a plurality of spaced-apart groups of leads, the mounting portion means having a series of regularly spaced index holes, the leads being separated from the mounting portion means after the molded plastic body is applied.

4. A package for a light-emitting diode as in claim 3 wherein:

the molded plastic body is essentially circular in the cross section perpendicular to the light-emitting diode optical is and has an annular protrusion at the lower portion of the body to retain a ferrule for mounting the package in a panel.

UNITED STATES PATENT OFFICE

CERTIFICATE OF CORRECTION

Patent No. 3,609,475 Dated September 28, 1971

Inventor(s) George N. Kaposhilin

It is certified that error appears in the above-identified patent and that said Letters Patent are hereby corrected as shown below:

Column 1, line 72, after "20" insert -- , --;

Column 3, line 3, "is" should read -- axis --.

Signed and sealed this 11th day of April 1972.

(SEAL)
Attest:

EDWARD M.FLETCHER,JR.
Attesting Officer

ROBERT GOTTSCHALK
Commissioner of Patents